United States Patent
Oh et al.

(10) Patent No.: US 11,216,208 B1
(45) Date of Patent: Jan. 4, 2022

(54) MEMORY SYSTEM, MEMORY CONTROLLER, AND OPERATION METHOD OF MEMORY SYSTEM

(71) Applicant: SK hynix Inc., Icheon-si (KR)

(72) Inventors: Chan Young Oh, Icheon-si (KR); Heung Tae Jin, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/087,404

(22) Filed: Nov. 2, 2020

(30) Foreign Application Priority Data

Jun. 15, 2020 (KR) .......................... 10-2020-0072024

(51) Int. Cl.
*G06F 3/06* (2006.01)
(52) U.S. Cl.
CPC .......... *G06F 3/0655* (2013.01); *G06F 3/0604* (2013.01); *G06F 3/0676* (2013.01); *G06F 3/0679* (2013.01)
(58) Field of Classification Search
None
See application file for complete search history.

(56) References Cited

U.S. PATENT DOCUMENTS

2019/0102097 A1\* 4/2019 Madraswala ......... G06F 3/0679
2019/0171360 A1\* 6/2019 Lee ....................... G06F 3/0673

FOREIGN PATENT DOCUMENTS

| KR | 10-2018-0060885 A | 6/2018 |
| KR | 10-2019-0019364 A | 2/2019 |
| KR | 10-2019-0064965 A | 6/2019 |

\* cited by examiner

*Primary Examiner* — Gary W. Cygiel
(74) *Attorney, Agent, or Firm* — Perkins Coie LLP

(57) ABSTRACT

Embodiments of the disclosed technology relate to a memory system, a memory controller, and an operation method of the memory system. According to embodiments of the present disclosure, the memory system may calculate a time period T1 that is between a beginning of a program operation on a memory page included in the memory device and a suspension of the program operation, may calculate a time period T2 that is between the suspension of the program operation and a time point that is before a resumption of the program operation, may calculate, based on the time period T1 and the time period T2, a read offset voltage to be applied to the memory cell to mitigate the change of the threshold voltage distribution, and may store the read offset voltage in the memory page in the memory device before the resumption of the program operation. Accordingly, the memory system is able to improve the reliability of operations of suspending and resuming a program operation and to improve the performance of a read operation.

22 Claims, 14 Drawing Sheets

MEMORY SYSTEM, MEMORY CONTROLLER, AND OPERATION METHOD OF MEMORY SYSTEM

CROSS REFERENCE TO RELATED APPLICATION

This patent document claims the priority and benefits of Korean patent application number 10-2020-0072024 filed on Jun. 15, 2020, which is incorporated herein by reference in its entirety.

TECHNICAL FIELD

The technology and implementations disclosed in this patent document relate to a memory system, a memory controller, and an operation method of the memory system.

BACKGROUND

Storage devices refer to electronic components that are used to store data on a permanent or temporary basis. Each storage device may include one or more storage medium to store data and operate based on a request from a host. Examples of the host include a computer, a mobile terminal (for example, a smartphone or a tablet), or various other electronic devices. The storage device can be classified based on the type of storage medium. For example, a hard disk drive (HDD) uses a magnetic disk as the storage medium and a solid state drive (SSD), a universal flash storage device (UFS), or an embedded MMC (eMMC) device use, as the storage medium, semiconductor devices such as a volatile memory device and a nonvolatile memory device.

A memory system may further include a memory controller for controlling the memory device. The memory controller may receive commands from the host and may execute or control operations for reading, writing, or erasing data in a volatile memory or a nonvolatile memory included in the memory system based on the received commands. The memory controller may drive firmware for performing a logical operation for controlling such operations.

SUMMARY OF THE INVENTION

Embodiments of the disclosed technology may provide a memory system, a memory controller, and an operation method of the memory system, which are capable of improving the reliability of a read operation after suspending a program operation.

In addition, embodiments of the present disclosure may provide a memory system, a memory controller, and an operation method of the memory device capable of improving the performance of a read operation.

In one aspect, a memory system is provided to include a memory device; and a memory controller configured to control the memory device, wherein the memory controller is configured to: calculate a time T1 between a time point at which a program operation on a memory page included in the memory device is started and a time point at which the program operation is suspended; calculate a time T2 between the time point at which the program operation is suspended and a time point just before the program operation is resumed; calculate a read bias offset corresponding to a target read bias among one or more read biases for reading the memory page on the basis of the time T1 and the time T2; and store the read bias offset in a page information (PI) area of the memory page before the program operation is resumed.

In another aspect, a memory system is provided to include a memory device including a memory device including a memory cell array including memory cells to provide digital storage, each memory cell programmable in multiple states, each state defined with a corresponding threshold voltage distribution; and a memory controller communicatively coupled to the memory device and configured to control the memory device, wherein the memory controller is configured to: calculate, in response to receiving a request to suspend a program operation during the program operation to program a certain state to a memory cell, a time period T1 that is between a beginning of the program operation and a suspension of the program operation, wherein the suspension of the program operation causes a change of the threshold voltage distribution of the certain state; calculate, in response to a request to resume the program operation, a time period T2 that is between the suspension of the program operation and a time point that is before a resumption of the program operation; calculate, based on the time period T1 and the time period T2, a read offset voltage to be applied to the memory cell to mitigate the change of the threshold voltage distribution; and store the read offset voltage in the memory device before the resumption of the program operation.

In another aspect, a memory controller is provided to comprise: a memory interface configured to communicate with a memory device; and a control circuit configured to control the memory device, wherein the control circuit is configured to: calculate a time T1 between a time point at which a program operation on a memory page included in the memory device is started and a time point at which the program operation is suspended; calculate a time T2 between the time point at which the program operation is suspended and a time point just before the program operation is resumed; calculate a read bias offset corresponding to a target read bias among one or more read biases for reading the memory page on the basis of the time T1 and the time T2; and store the read bias offset in a page information (PI) area of the memory page before the program operation is resumed.

In another aspect, a memory controller is provided to include a memory interface configured to communicate with a memory device including a memory page including memory cells, each memory cell programmable in multiple states, each state defined with a corresponding threshold voltage distribution; and a control circuit configured to control the memory device, wherein the control circuit is configured to: calculate, in response to receiving a request to suspend a program operation during the program operation to program a certain state to the memory page, a time period T1 that is between a beginning of the program operation and a suspension of the program operation, wherein the suspension of the program operation causes a change of the threshold voltage distribution of the certain state; calculate, in response to a request to resume the program operation, a time period T2 that is between the suspension of the program operation and a time point that is before a resumption of the program operation; calculate, based on the time period T1 and the time period T2, a read offset voltage to be applied to the memory block to mitigate the change of the threshold voltage distribution; and store the read offset voltage in the memory page before the resumption of the program operation.

In another aspect, an operation method of a memory system comprising a memory device is provided. The operation method comprises: calculating a time period T1 between a beginning of a program operation on a memory cell included in a memory page in the memory device and a suspension of the program operation; calculating a time period T2 between the suspension of the program operation and a time point that is before a resumption of the program operation; calculating, based on the time period T1 and the time period T2, a read offset voltage to be applied to the memory cell to mitigate a change of a threshold voltage distribution of a certain state of a memory cell, the change caused due to the suspension of the program operation; and storing the read offset voltage in the memory page in the memory device before the resumption of the program operation.

According to embodiments of the present disclosure, it is possible to improve the reliability of a read operation after suspending a program operation.

In addition, according to embodiments of the disclosed technology, it is possible to improve the performance of a read operation.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE EXEMPLARY EMBODIMENTS

Hereinafter, embodiments of the disclosed technology will be described in detail with reference to the accompanying drawings.

Various implementations of the disclosed technology are provided to a memory system capable of improving the reliability of a read operation that is performed after a suspension of a program operation being performed.

In some circumstances, during the program operation (write operation) programming data to the memory device, the memory system may need to suspend the write operation and execute a read operation. The program operation suspended may then resume after the read operation. In this case, there may be a problem in that a threshold voltage distribution of the memory cells, on which the program operation is in progress, among the memory cells included in the memory device changes due to the suspension of the program operation. The change of the threshold voltage distribution might cause the reliability of the read operation performed after the suspension of the program operation to deteriorate. To mitigate the deteriorations, the memory system used to limit the time from the suspension of the write operation to the resumption of the write operation. However, such limiting of the time also lowers the performance and reliability of the read operation. In recognition of the above, the disclosed technology provides various implementations to address the deterioration of the performance and reliability of the read operation FIG. 1 is a diagram illustrating the schematic configuration of a memory system 100 according to an embodiment of the disclosed technology.

Figure 1:
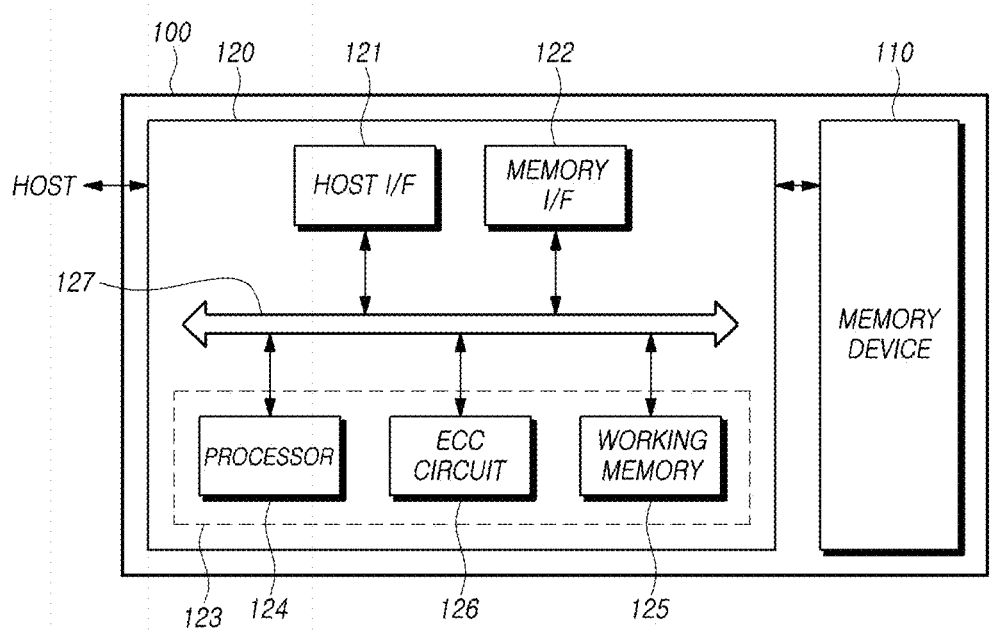
FIG. 1 is a diagram illustrating a schematic configuration of a memory system based on some implementations of the disclosed technology.

Referring to FIG. 1, the memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a "write operation"), an erasure operation, and the like.

The memory device 110 may include a memory cell array including multiple memory cells (also simply referred to as "cells") configured to store data. In some implementations, each of the memory cells can be structured or operated to store a single bit or more bits of information. The memory cell array may be organized in different blocks and pages for memory operations. The cells of the memory cell array may be organized to include a plurality of memory blocks. Each memory block may include a plurality of pages, and each page corresponds to a plurality of memory cells.

For example, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. In some implementations, embodiments of the disclosed technology are applicable to a flash memory device having an electric charge storage layer configured as a conductive floating gate. In some other implementations, the embodiments of the disclosed technology are applied a flash memory device having a charge trap flash (CTF) having an electric charge storage layer configured as an insulating film.

The memory controller 120 can access the memory device 110 based on requests from the user/host by providing command/address signals to the memory controller 120. In some implementations, the memory device 110 may be configured to receive, from the memory controller, a command and an address in which the command is performed or executed, and access an area of the memory cell array selected using the address. For example, the memory device 110 may perform an operation corresponding to the received command in a memory area of the memory device having a physical address corresponding to the received address from the memory controller 120.

For example, the memory device 110 may perform a program operation, a read operation, an erasure operation, or others. During the program operation, the memory device 110 may program data in the area selected by the address. During the read operation, the memory device 110 may read data from the area selected by the address. During the erasure operation, the memory device 110 may erase data stored in the area selected by the address.

The memory controller 120 may control write (program), read, erasure, or background operations with regard to the memory device 110. The background operation may include, for example, at least one among a garbage collection operation (GC), a wear leveling (WL) operation, and a bad block management (BBM) operation. The term "garbage collection" as used herein may refer to a form of memory management, in which a garbage collector attempts to reclaim (garbage) memory that is occupied by objects that are no longer in use. The wear leveling indicates techniques for prolonging lifetime of erasable storage devices.

The memory controller 120 may control the operation of the memory device 110 at the request of a host. Alternatively, the memory controller 120 may control the operation of the memory device 110 without a corresponding request of the host, such as, for example, when it performs one or more background operations of the memory device.

The memory controller 120 and the host may be separate devices. In some cases, the memory controller 120 and the host may be integrated and implemented as a single device. In the following description, the memory controller 120 and the host are separate devices.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be connected to the memory device 110 to provide an interface for communication with the memory device 110. That is, the memory interface 122 may be configured to provide the memory device 110 and the memory controller 120 with an interface in response to a control of the control circuit 123.

The control circuit 123 may be configured to control the operation of the memory device 110 by performing operations for an overall control of the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, according to the mapping unit. Typical address mapping methods may include a page mapping method, a block mapping method, and a hybrid mapping method.

The processor 124 may be configured to randomize data received from the host. For example, the processor 124 may randomize data received from the host by using a randomizing seed. The randomized data is provided to the memory device 110 as data to be stored, and is programmed in the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program executed inside the memory system 100, and may include various functional layers.

For example, the firmware may include at least one of a flash translation layer (FTL) configured to translate between a logical address that the host HOST requests the memory system 100 to provide and a physical address of the memory device 110, a host interface layer (HIL) configured to interpret a command that the host HOST issues to the memory system 100 (storage device) and to deliver the same to the FTL, and a flash interface layer (FIL) configured to deliver a command issued by the FTL to the memory device 110.

For example, the firmware may be stored in the memory device 110, then loaded into the working memory 125.

The working memory 125 may store firmware, program codes, commands, or pieces of data necessary to drive the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect an error bit of check target data by using an error correction code, and to correct the detected error bit. For example, the check target data may be data stored in the working memory 125, data retrieved from the memory device 110, or the like.

The error detection/correction circuit 126 may be implemented to decode data by using the error correction code. The error detection/correction circuit 126 may be implemented by using various code decoders. For example, a decoder that performs nonsystematic code decoding or a decoder that performs systematic code decoding may be used.

For example, the error detection/correction circuit 126 may detect an error bit, sector by sector, with regard to each piece of read data. Each piece of read data may include multiple sectors. As used herein, a sector may refer to a data unit smaller than the read unit (page) of a flash memory. Sectors constituting each piece of read data may correspond to each other via an address.

The error detection/correction circuit 126 may calculate a bit error rate (BER) and determine whether or not correction can be made sector by sector. For example, if the BER is higher than a reference value, the error detection/correction circuit 126 may determine that the corresponding sector is uncorrectable or "a fail". If the BER is lower than or equals to the reference value, the error detection/correction circuit 126 may determine that the corresponding sector is correctable or "a pass".

The error detection/correction circuit 126 may perform error detection and correction operations successively with regard to all pieces of read data. When a sector included in the read data is correctable, the error detection/correction circuit 126 may omit the error detection and correction operations related to the corresponding sector with regard to the next piece of read data. After finishing error detection and correction operations with regard to all pieces of read data in this manner, the error detection/correction circuit 126 may detect a sector deemed uncorrectable to the end. There may be one or more sectors deemed uncorrectable. The error detection/correction circuit 126 may deliver information (for example, address information) regarding the sectors deemed uncorrectable to the processor 124.

The bus 127 may be configured to provide a channel between the constituent elements 121, 122, 124, 125, and 126 of the memory controller 120. The bus 127 may include, for example, a control bus for delivering various types of control signals and commands, and a data bus for delivering various types of data.

The above-mentioned constituent elements 121, 122, 124, 125, and 126 of the memory controller 120 are only provided as examples. It is noted that some of the above-mentioned constituent elements 121, 122, 124, 125, and 126 of the memory controller 120 may be omitted, or some of the above-mentioned constituent elements 121, 122, 124, 125, and 126 of the memory controller 120 may be integrated into a single element. In addition, in some cases, one or more other constituent elements may be added, in addition to the above-mentioned constituent elements of the memory controller 120.

Hereinafter, the memory device 110 will be described in more detail with reference to FIG. 2.

Figure 2:
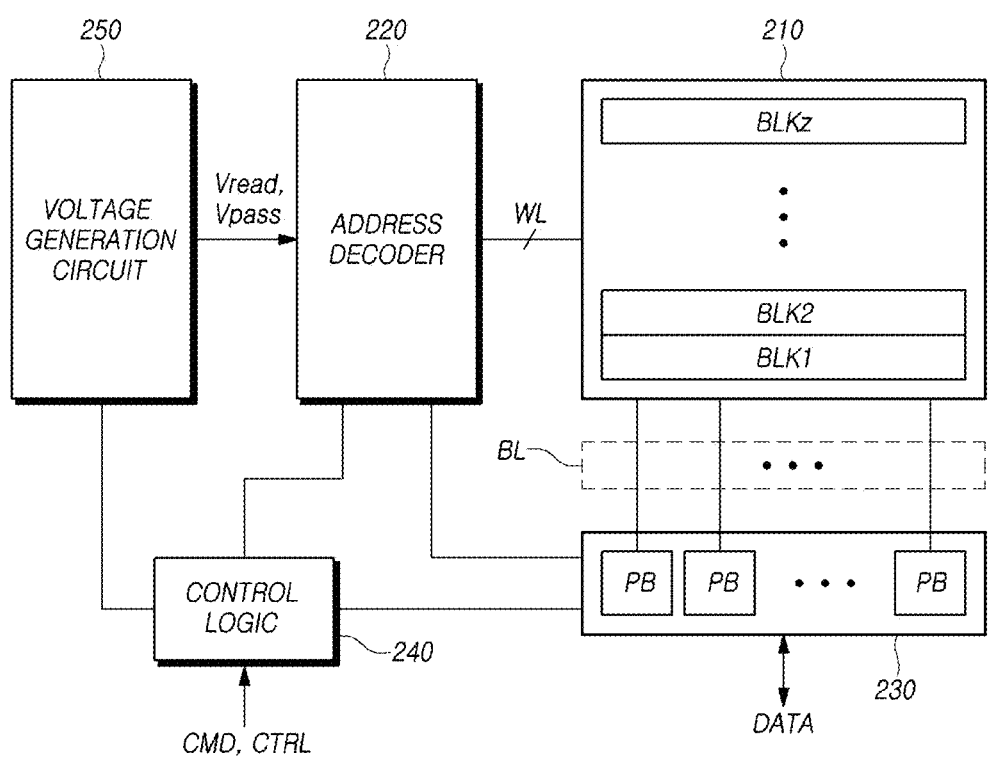
FIG. 2 is a block diagram schematically illustrating a memory device based on some implementations of the disclosed technology.

FIG. 2 is a block diagram schematically illustrating a memory device 110 according to an embodiment of the disclosed technology.

Referring to FIG. 2, the memory device 110 based on some implementations of the disclosed technology may include a memory cell array 210, an address decoder 220, a read/write circuit 230, a control logic 240, and a voltage generation circuit 250.

The memory cell array 210 may include multiple memory blocks BLK1 to BLKz, where z is a natural number equal to or larger than 2.

In the multiple memory blocks BLK1 to BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells having a vertical channel structure.

The memory cell array 210 may include a memory cell array having a two-dimensional structure or a memory cell array having a three-dimensional structure.

Each of the multiple memory cells included in the memory cell array 210 may store at least one bit of data. For example, each of the multiple memory cells included in the memory cell array 210 may be a single-level cell (SLC) configured to store one bit of data per memory cell. As another example, each of the multiple memory cells included in the memory cell array 210 may be a multi-level cell (MLC) configured to store two bits of data per memory cell. In another example, each of the multiple memory cells included in the memory cell array 210 may be a triple-level cell (TLC) configured to store three bits of data per memory cell. In another example, each of the multiple memory cells included in the memory cell array 210 may be a quad-level cell (QLC) configured to store four bits of data per memory cell. In another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to a command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may apply the read voltage Vread to a selected word line WL inside a selected memory block, when applying the read voltage during a read operation, and may apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation based on a page basis. In some implementations, the memory cell array may include memory blocks and each memory block may include a plurality of pages, each page corresponding to a plurality of memory cells. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that can hold data for data processing and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, an electric change proportional to the current based on the program state of a corresponding memory cell, and may latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG and multiple strings. The multiple pages PG correspond to multiple word lines WL, and the multiple strings STR correspond to multiple bit lines BL.

In the memory block BLK, multiple word lines WL and multiple bit lines BL may be arranged to intersect. For example, each of the multiple word lines WL may be arranged in the row direction, and each of the multiple bit lines BL may be arranged in the column direction. In another example, each of the multiple word lines WL may be arranged in the column direction, and each of the multiple bit lines BL may be arranged in the row direction.

The multiple word lines WL and the multiple bit lines BL may intersect with each other, thereby defining multiple memory cells MC. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1 to BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed on a page basis, and an erasure operation may be performed memory block on a memory block basis.

Figure 3:
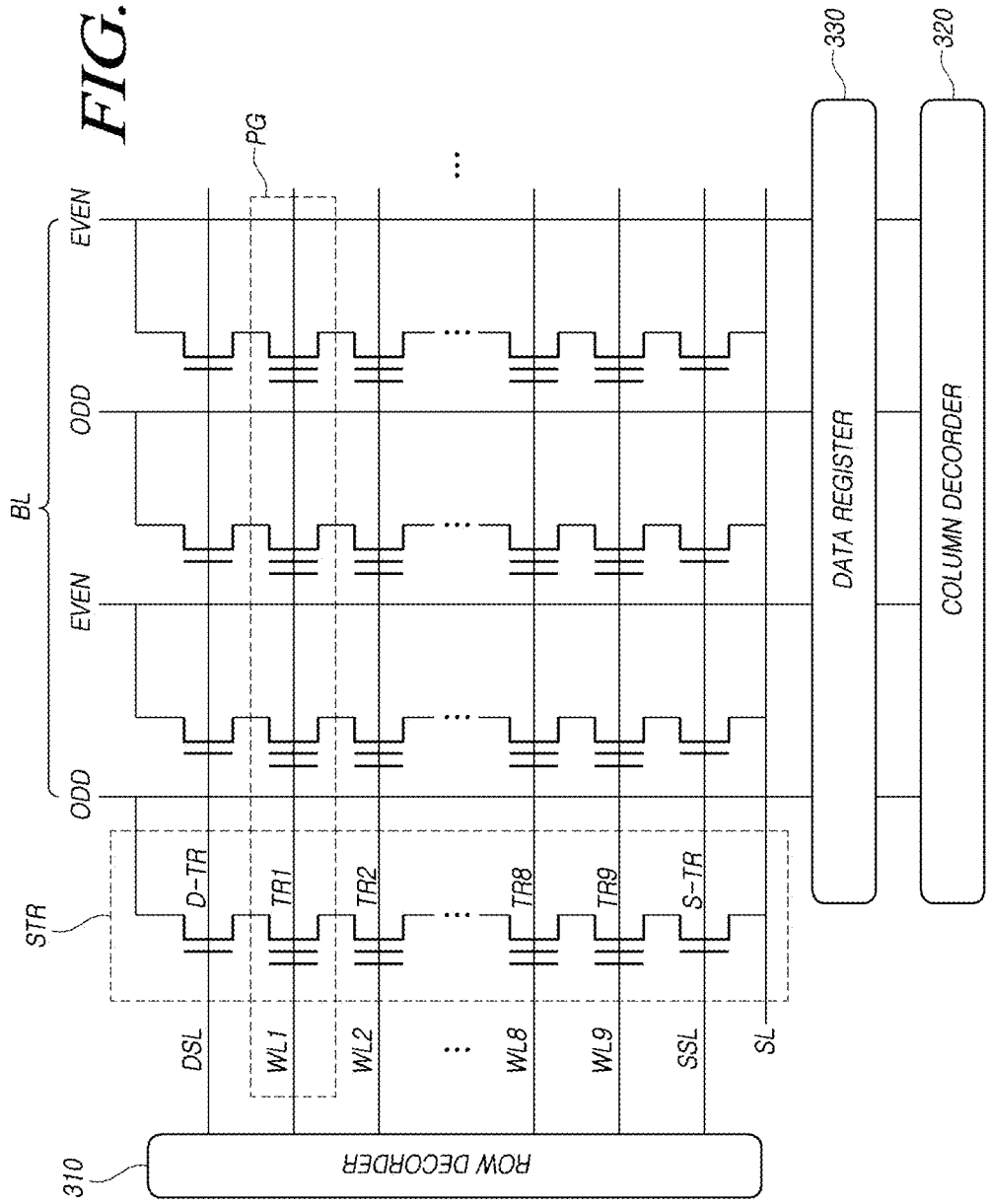
FIG. 3 is a diagram illustrating a structure of word lines and bit lines of a memory device based on some implementations of the disclosed technology.

FIG. 3 is a diagram illustrating a structure of word lines WL and bit lines BL of a memory device 110 according to an embodiment of the disclosed technology.

Referring to FIG. 3, the memory device 110 has a core area in which memory cells MC are concentrated, and an auxiliary area which corresponds to the remaining area other than the core area. The auxiliary area includes circuitry for supporting the operations of the memory cell array 210.

The core area may include pages PG and strings STR. In some implementations, multiple word lines WL1-WL9 and multiple bit lines BL are arranged to intersect.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3.

When each of the multiple word lines WL1-WL9 has a large size, each of the multiple word lines WL1-WL9 may correspond to at least two (for example, two or four) pages PG. Each page PG is the smallest unit in connection with conducting a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line BL and even-numbered bit line B are coupled in common to a column decoder 320.

The address may be used to access one or more memory cells MC in the core area. The address can be provided through the input/output end to the row decoder 310 and the column decoder 320 to select a corresponding target memory cell. In some implementations, a target memory cell may refer to one of the memory cells MC that is targeted to be accessed from the memory controller or the user, and in some implementations, the memory cell MC may be located at intersections between the word lines WL1-WL9 connected to the row decoder 310 and the bit lines BL connected to the column decoder 320.

Pages PG in a first direction (for example, X-axis direction) are connected to a commonly used line referred to as a word line WL, and strings STR in a second direction (for example, Y-axis direction) are connected to a common line referred to as a bit line BL. The voltage applied to a memory cell MC in the middle position or last position among memory cells MC connected in series may slightly differ from the voltage applied to the memory cell MC in the first position and from the voltage applied to the memory cell MC in the last position, due to the voltage drop across the preceding memory cell MC.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, which degrades the overall performance of the memory device 110.

Referring to the example illustrated in FIG. 3, in one string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding string STR to the data register 330. The second selection transistor S-TR is used as a switch circuit that connects the corresponding string STR to the source line SL. Thus, the first selection transistor D-TR and the second selection transistor S-TR can be used to enable or disable the corresponding string STR and deliver/block signals.

During a program operation, the memory system 100 fills the target memory cell MC of the bit line BL which is to be programmed with electrons. Accordingly, the memory system 100 applies a predetermined turn-on voltage Vcc to the gate electrode of the first selection transistor D-TR, thereby turning on the first selection transistor D-TR, and applies a predetermined turn-off voltage (for example, 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding string STR and drain to the source line SL, which corresponds to the ground voltage, such that the voltage level of the bit line BL can be measured. However, during a read operation, there may be a time difference in the on/off timing between the first selection transistor D-TR and the second selection transistor S-TR.

The memory system 100 may apply a predetermined voltage (for example, +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gate FG of the selected memory cell.

Figure 4:
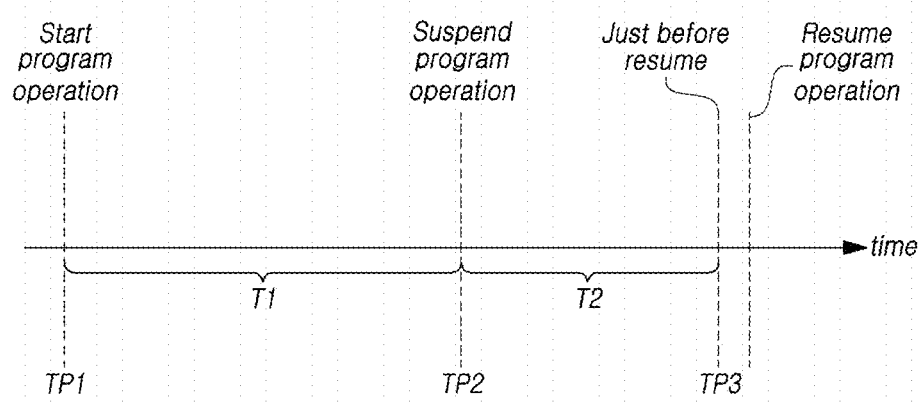
FIG. 4 is a diagram illustrating a process in which a program operation is started, suspended, and resumed.

FIG. 4 is a diagram illustrating a process in which a program operation is started, suspended, and resumed.

Referring to FIG. 4, the memory controller 120 of the memory system 100 may start a program operation on a memory page included in the memory device 100, and may then suspend the corresponding program operation according to a request from a host HOST. The memory page is a unit of a read operation or a program operation in the memory device 110.

At this time, the memory controller 120 may calculate a time T1 between the time at which the program operation on the memory page is started and the time at which the program operation is suspended. The memory controller 120 may check a time point TP1 at which a program command for starting a program operation is input to the memory device 110, and may check a time point TP2 at which a suspend command for suspending the program operation is input to the memory device 110, thereby calculating the time T1 by the difference between the time point TP2 and the time point TP1.

In addition, the memory controller 120 may calculate a time T2 between the time point at which the program operation on the memory page is suspended and the time point just before the program operation is resumed. The memory controller 120 may check a time point TP2 at which a suspend command for suspending the program operation is input to the memory device 110, and may check a time point TP3 just before a resume command for resuming the program operation is input to the memory device, thereby calculating the time T2 by the difference between the time point TP3 and the time point TP2.

The time point TP3 may be a specific time point before the memory controller 120 inputs a resume command to the memory device 110. For example, the time point TP3 may be a specific time point after the memory controller 120 completes all read requests received from the host HOST after the program operation is suspended or after conditions for resuming the program operation (e.g., the number of times the read operation is executed after the program operation is suspended, and the time during which the program operation is maintained to be suspended) are satisfied.

Meanwhile, the memory controller 120 may use a timer (e.g., RTC) positioned inside or outside the memory system 100 in order to check the time points TP1, TP2, and TP3.

Figure 5:
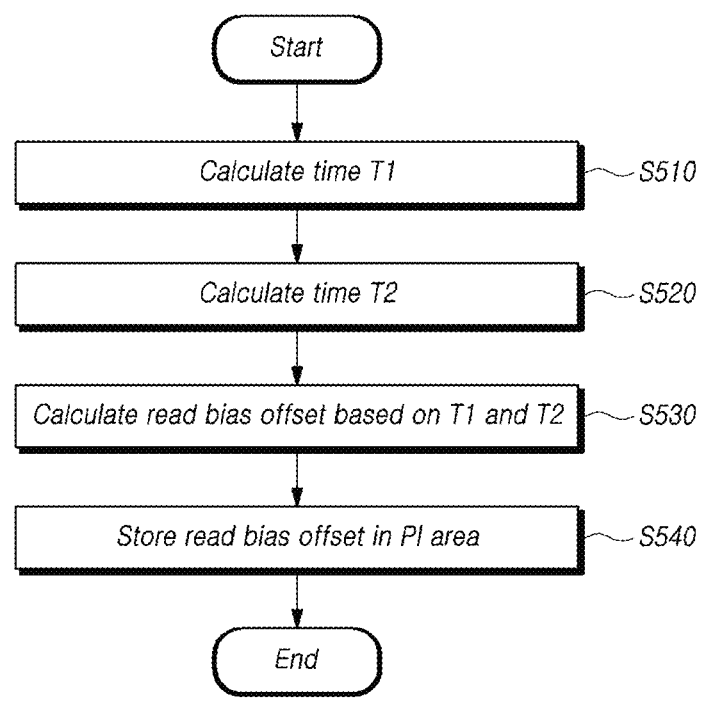
FIG. 5 is a flowchart illustrating an example of the operation of a memory system based on some implementations of the disclosed technology.

FIG. 5 is a flowchart illustrating an example of the operation of a memory system 100 according to embodiments of the disclosed technology.

Referring to FIG. 5, the memory controller 120 of the memory system 100 may calculate the time T1 described in FIG. 4 above (S510). In addition, the memory controller 120 of the memory system 100 may calculate the time T2 described in FIG. 4 above (S520).

Thereafter, the memory controller 120 of the memory system 100 may calculate a read bias offset corresponding to a target read bias among one or more read biases for reading a memory page on the basis of the time T1 and the time T2 (S530).

The read bias offset (it can be referred to as the read offset voltage) corresponding to the read bias is a value indicating the degree of change in a value of the read bias (it can be referred to as the read voltage), applied when executing a read operation on the memory page, from a set read bias. If a plurality of read biases is available when executing a read operation, read bias offsets corresponding to the respective read biases may be different from each other.

A detailed method in which the memory controller 120 calculates a read bias offset corresponding to the target read bias will be described in detail with reference to FIGS. 6 to 8 later.

In addition, the memory controller 120 of the memory system 100 may store the read bias offset calculated in step S530 in a page information (PI) area of the memory page before the program operation is resumed (S540). The memory controller 120 may input a command for storing the read bias offset in the PI area of the memory page to the memory device 110.

The PI area of the memory page is a spare area in which additional information, that is, information on the corresponding memory page, instead of user data, is stored.

An operation of storing the read bias offset in the PI area will be described in more detail with reference to FIGS. 9 to 11 later.

As described above, the read bias offset stored in the PI area of the memory page may be used to correct a change in the threshold voltage distribution caused by suspension of the program operation when reading the data stored in the memory page later. Therefore, the possibility of a failure occurring in the process of reading the data stored in the memory page may be reduced, thereby improving the performance of the read operation. In addition, there is no need to limit the time to suspend the program operation due to the failure caused by the process of reading the data stored in the memory page afterwards. Therefore, even when the program operation is being executed, the read operation requested by the host is able to be processed more quickly, thereby improving the reliability of the read operation after suspending the program operation.

The threshold voltage distribution of memory cells included in the memory device 110 will be preferentially described in order to describe a detailed operation in which the memory controller 120 calculates a read bias offset. Although an example in which memory cells included in the memory device 110 are triple-level cells (TLCs) for storing 3-bit data will be described in the embodiment of the disclosed technology, the embodiments of the disclosed technology may be applied in the same manner to the case in which the memory cells included in the memory device 110 are single-level cells (SLCs), multi-level cells (MLCs), quad-level cells (QLCs), or the like.

Figure 6:
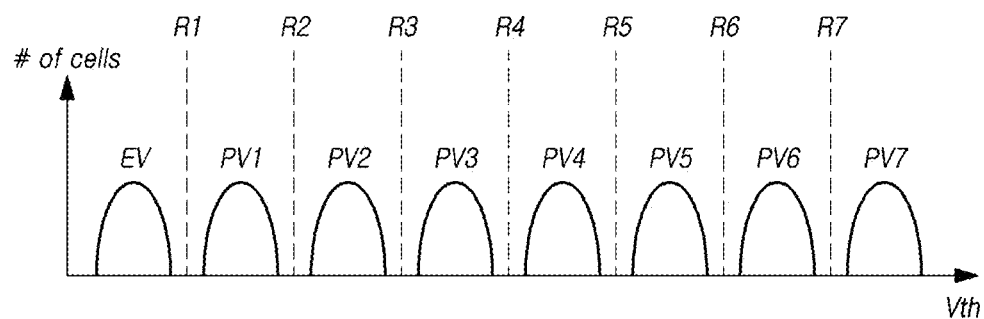
FIG. 6 is a diagram illustrating an example of threshold voltage distribution of memory cells based on some implementations of the disclosed technology.

FIG. 6 is a diagram illustrating an example of the threshold voltage distribution of memory cells based on some embodiments of the disclosed technology.

FIG. 6 shows an example of a memory cell that corresponds to a triple-level cell (TLCs) that can be programmed to any one of program states PV1, PV2, PV3, PV4, PV5, PV6, and PV7 or erased to an erase state EV. The program operation and the erase operation may depend on values of a least significant bit (LSB), a center significant bit (CSB), and a most significant bit (MSB) such that the memory cell has a threshold voltage distribution corresponding to one of the program states and the erase state.

In some implementations, when an operation of reading data of a memory cell is executed, any one of a plurality of read biases R1, R2, R3, R4, R5, R6, and R7 used to read data programmed in the memory cell may be applied to the memory cell. For example, a first read bias R1 is a voltage level between the erase state EV and a first program state PV1, a second read bias R2 is a voltage level between the first program state PV1 and a second program state PV2, a third read bias R3 is a voltage level between the second program state PV2 and a third program state PV3, a fourth read bias R4 is a voltage level between the third program state PV3 and a fourth program state PV4, a fifth read bias R5 is a voltage level between the fourth program state PV4 and a fifth program state PV5, a sixth read bias R6 is a voltage level between the fifth program state PV5 and a sixth program state PV6, and a seventh read bias R7 is a voltage level between the sixth program state PV6 and a seventh program state PV7.

The patterns of the threshold voltage distribution and the arrangement of the read biases, which are described for the triple-level cells, can be also applied to single-level cells (SLCs), multi-level cells (MLCs), quad-level cells (QLCs), or other types of memory cells, with some modifications on the number of program states and the number of read biases.

Figure 7A:
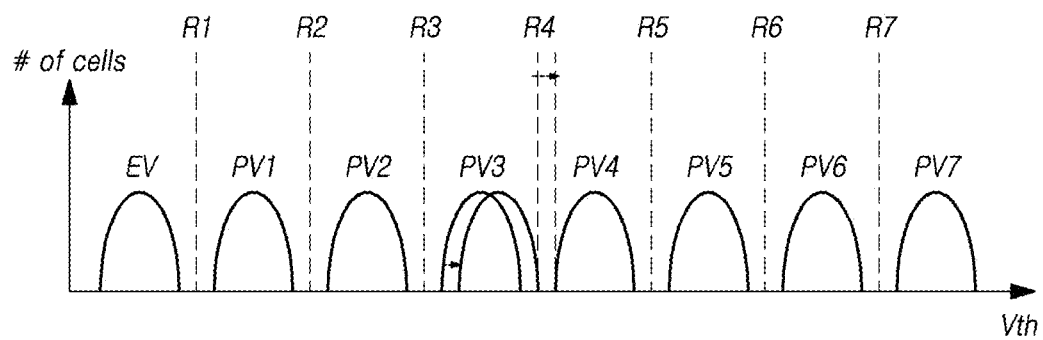
FIGS. 7*a* and 7*b* show diagrams illustrating examples of changes in threshold voltage distribution and read biases depending on time T1 from a start of a program operation to a suspension of the program operation based on some implementations of the disclosed technology.
Figure 7B:
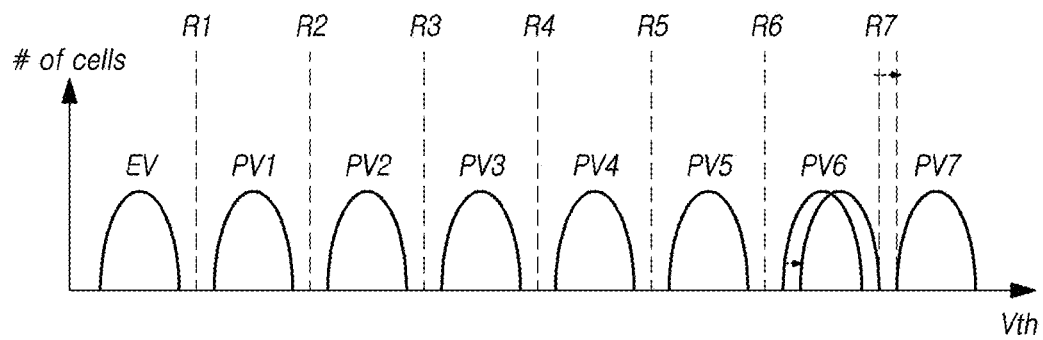

FIGS. 7a and 7b show diagrams illustrating examples of changes in threshold voltage distributions and read biases depending on time T1 from the start of a program operation to the suspension of the program operation in an embodiment of the disclosed technology.

Referring to FIGS. 7a and 7b, the memory controller 120 may determine, depending on the time T1, the program states of the memory cells that are being programmed when the program operation is suspended. T1 corresponds to a time period between the start of the program operation and the suspension of the program operation. For example, the memory controller 120 may determine that the program states being programmed are associated with greater threshold voltage values as the value of the time T1 increases.

For example, when the value of the time T1 is "A" (e.g., 700 us) as shown in FIG. 7a, the memory controller 120 may determine that the program operation is suspended while the memory cell in the third program state PV3 is being programmed.

In another example, when the value of the time T1 is "B" (e.g., 1500 us) as shown in FIG. 7b, the memory controller 120 may determine that the program operation is suspended while the memory cell in the sixth program state PV6 is being programmed.

Based on the above, it is possible to determine that which read bias among the plurality of read biases R1, R2, R3, R4, R5, R6, and R7 is changed due to the suspension of the program operation. Such determination may depend on the program states of the memory cells that are being programmed when the program operation is suspended. In the process in which the program operation is suspended and resumed, a widening phenomenon occurs in which the threshold voltage distribution of the memory cells that are being programmed is widened due to the suspension of the program operation. The widening phenomenon causes the overall threshold voltage of a corresponding memory cell being programmed to increase.

When the value of the time T1 is "A", the threshold voltage distribution of the memory cells in the third program state PV3 may be changed. In this case, if the threshold voltage distribution of the memory cells in the third program state PV3 is changed, a failure is likely to occur in the process of distinguishing the memory cell in the third program state PV3 from the memory cell in the fourth program state PV4. In order to minimize the failure, the value of the fourth read bias R4, which is a voltage level between the third program state PV3 and the fourth program state PV4, needs to be changed. The reason to change the value of the fourth read bias R4 instead of the third read bias R3 is that the difference between the fourth read bias R4 and the threshold voltage of the memory cells in the third program state PV3 is reduced because the widening phenomenon occurred due to the suspension of the program operation causes the overall threshold voltage of the memory cells, to increase as described above.

When the value of the time T1 is "B", the threshold voltage distribution of the memory cells in the sixth program state PV6 may be changed. In this case, the threshold voltage distribution of the memory cells in the sixth program state PV6 may be changed, so that a failure is likely to occur in the process of distinguishing the memory cells in the sixth program state PV6 from the memory cells in the seventh program state PV7. In order to minimize the failure, the value of the seventh read bias R7, which is a voltage level between the sixth program state PV6 and the seventh program state PV7, needs to be changed. The reason to change the seventh read bias R7 instead of the sixth read bias R6 is that the difference between the seventh read bias R7 and the threshold voltage of the memory cells in the sixth program state PV6 is reduced because the widening phenomenon occurred due to the suspension of the program operation causes the overall threshold voltage of the memory cells to increase as described above.

As described above, depending on the time T1, which program state of the memory cells is being programmed at the time of the suspension of the program operation is determined, and the read bias to be changed is determined as a target read bias depending on the program state of the memory cells that was being programmed at the time of the suspension of the program operation. Therefore, the memory controller 120 may determine a read bias to be changed, i.e., the target read bias, based on the time T1. The target read bias is used for calculating a corresponding read bias offset that is applied to adjust the target read bias.

Figure 8A:
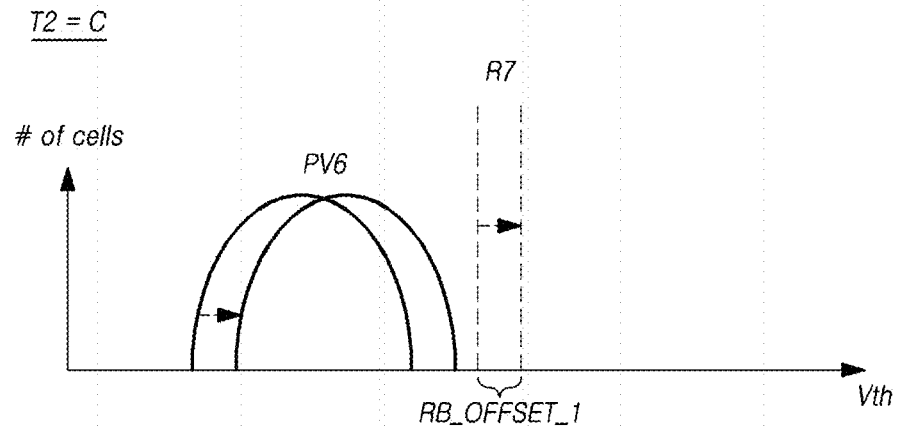
FIGS. 8*a* and 8*b* show diagrams illustrating examples of changes in a read bias offset depending on time T2 from a suspension of a program operation to a resumption of a program operation based on some implementations of the disclosed technology.
Figure 8B:
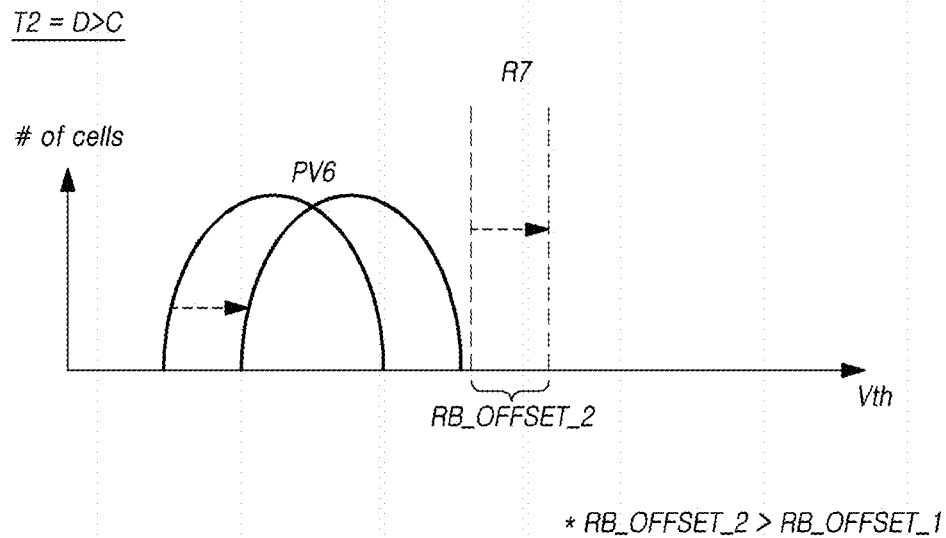

FIGS. 8a and 8b show diagrams illustrating examples of changes in a read bias offset depending on time T2 from the suspension of a program operation to the resumption of the program operation based on some embodiment of the disclosed technology.

FIGS. 8a and 8b illustrate the cases where the memory controller 120 of the memory system 100 changes the value of the seventh read bias R7 due to a change in the threshold voltage distribution of the memory cells in the sixth program state PV6. The description made with reference to FIG. 8 may be applied to other program states and read biases as well.

Referring to FIG. 8a, when the value of the time T2 is "C", the threshold voltage distribution of the memory cells in the sixth program state PV6 may be changed, so that the memory controller 120 may change the value of the seventh read bias R7. Here, the difference value by which the seventh read bias R7 is changed will be referred to as a "first read bias offset" RB_OFFSET_1.

FIG. 8b shows the value of the time T2 is "D" (in this case, it is assumed that the value D is greater than the value C). In FIG. 8b, the threshold voltage distribution of the memory cells in the sixth program state PV6 may be changed, so that the value of the seventh read bias R7 may be changed. Here, the difference value by which the seventh read bias R7 is changed will be referred to as a "second read bias offset" RB_OFFSET_2.

The second read bias offset RB_OFFSET_2 is greater than the first read bias offset RB_OFFSET_1. The value of the read bias offset may increase in proportion to the time T2. This is due to the fact that as the suspension period increases, the threshold voltage distribution of the memory becomes wider and thus the read bias offset increases.

Figure 9:
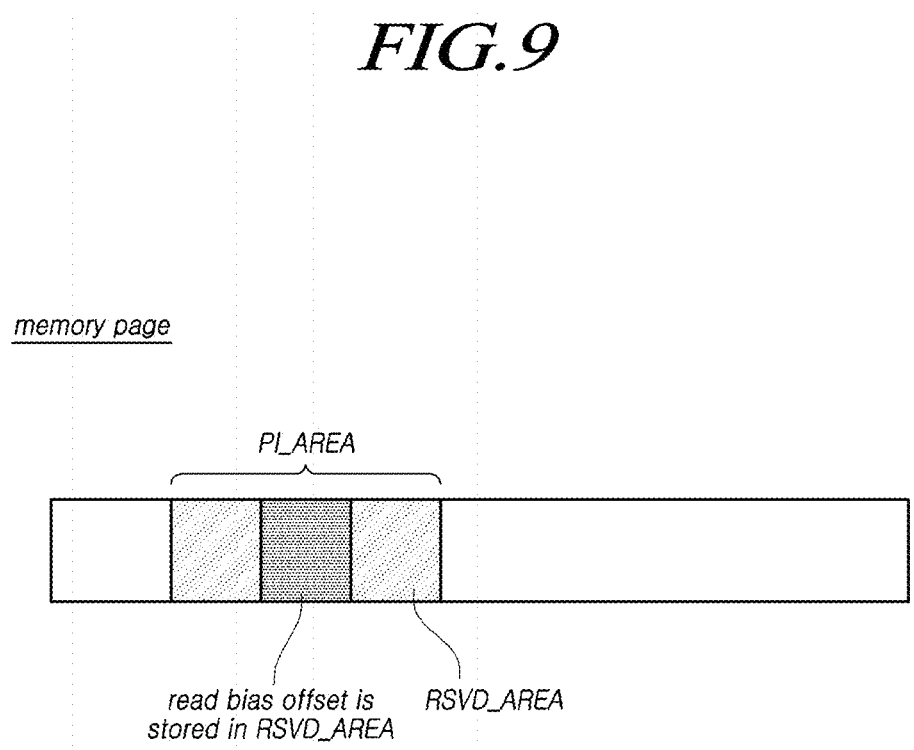
FIG. 9 is a diagram illustrating a PI area of a memory page based on some implementations of the disclosed technology.

FIG. 9 is a diagram illustrating a PI area of a memory page according to embodiments of the disclosed technology.

As described above, the memory controller 120 of the memory system 100 may store read bias offsets in a PI area PI_AREA of a memory page. In this case, the read bias offsets may be stored in a reserved area RSVD_AREA of the PI area PI_AREA. For example, in the case where the size of the PI area PI_AREA is 64 bytes, the size of the reserved area RSVD_AREA may be 3 bytes since the areas other than the reserved area RSVD_AREA in the PI area PI_AREA are pre-allocated to indicate specific information on the memory page (e.g., a logical address corresponding to the physical address of the memory page), the read bias offsets may be stored in the reserved area RSVD_AREA.

The memory controller 120 may input a command for storing the read bias offsets to the memory device 110 in order to store the read bias offsets in the reserved area RSVD_AREA of the PI area PI_AREA.

Figure 10:
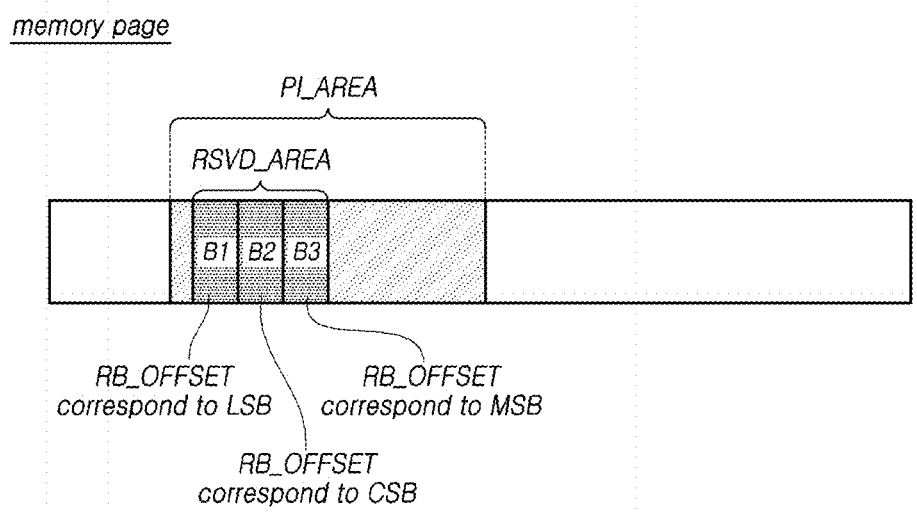
FIG. 10 is a diagram illustrating an example in which read bias offsets are stored in the PI area shown in FIG. 9.

FIG. 10 is a diagram illustrating an example in which read bias offsets are stored in the PI area shown in FIG. 9. When data having multiple bits are stored in a memory cell, different multiple read bias voltages can be used to determine LSB (Least Significant Bit), CSB (Center Significant Bit), and MSB (Most Significant Bit) of the data.

Referring to FIG. 10, when storing read bias offsets in the reserved area RSVD_AREA, the memory controller 120 may store a read bias offset corresponding to a read bias for identifying an LSB in a first byte B1, may store a read bias offset corresponding to a read bias for identifying a CSB in a second byte B2, and may store a read bias offset corresponding to a read bias for identifying an MSB in a third byte B3.

In the case where a plurality of pieces of bit data is stored in a memory cell, the read bias used to identify the LSB, the read bias used to identify the CSB, and the read bias used to identify the MSB may be different from each other. Therefore, in order to distinguish from the read bias offsets corresponding to different read biases, the memory controller 120 may store the read bias offset corresponding to the read bias for identifying the LSB, the read bias offset corresponding to the read bias for identifying the CSB, and the read bias offset corresponding to read bias for identifying the MSB in different bytes of the reserved area RSV-D_AREA.

Although it is illustrated in FIG. 10 that the first byte B1, the second byte B2, and the third byte B3 are adjacent to each other, the first byte B1, the second byte B2, and the third byte B3 may not be adjacent to each other, and the sequence of the first byte B1, the second byte B2, and the third byte B3 may be arbitrarily determined.

Figure 11:
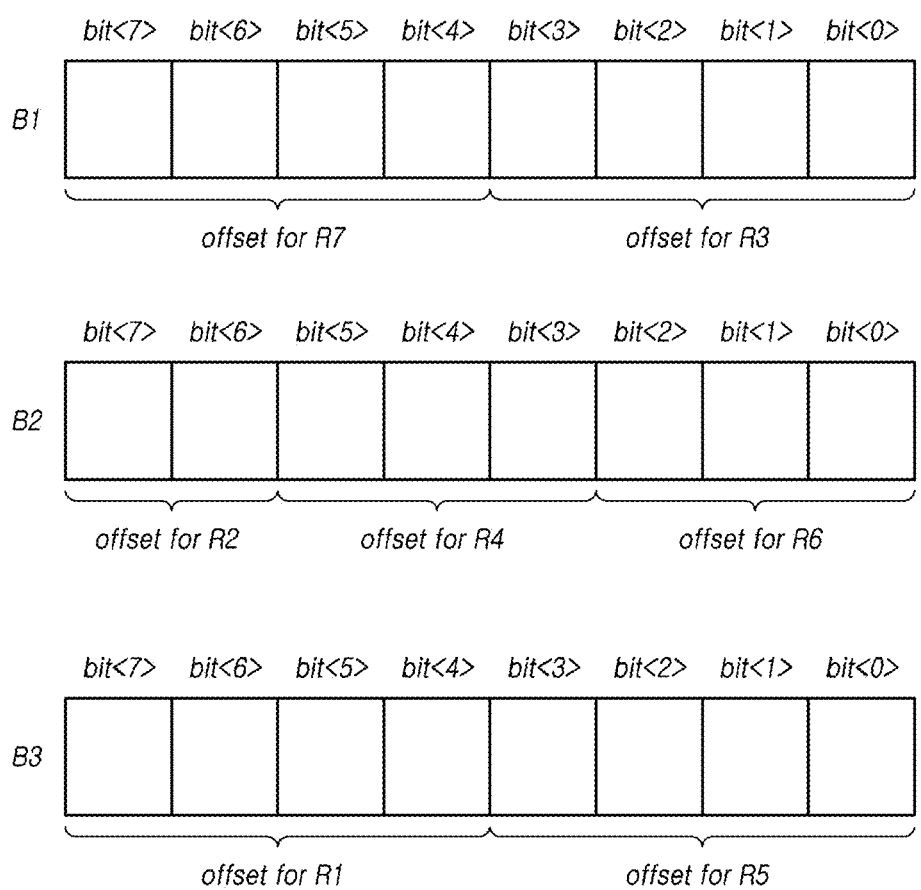
FIG. 11 is a diagram illustrating an example of the configurations of the first byte, the second byte, and the third byte shown in FIG. 10.

FIG. 11 is a diagram illustrating an example of the configurations of the first byte, the second byte, and the third byte shown in FIG. 10.

Referring to FIG. 11, the first byte B1 may store read bias offsets corresponding to two different read biases. For example, 4 bits from bits 7 to 4 of the first byte B1 may store a read bias offset corresponding to the seventh read bias R7, and 4 bits from bits 3 to 0 thereof may store a read bias offset corresponding to the third read bias R3.

The third byte B3 may also store read bias offsets corresponding to two different read biases. For example, 4 bits from bits 7 to 4 of the third byte B3 may store a read bias offset corresponding to the first read bias R1, and 4 bits from bits 3 to 0 thereof may store a read bias offset corresponding to the fifth read bias R5.

On the other hand, unlike the first byte B1 and the third byte B3, the second byte B2 may store read bias offsets corresponding to three different read biases. For example, 2 bits from bits 7 to 6 of the second byte B2 may store a read bias offset corresponding to the second read bias R2, 3 bits from bits 5 to 3 thereof may store a read bias offset corresponding to the fourth read bias R4, and 3 bits from bits 2 to 0 thereof may store a read bias offset corresponding to the sixth read bias R6.

The operation in which the memory controller 120 stores the read bias offsets in the PI area of the memory page has been described in the above embodiment.

Hereinafter, an example in which the read bias offsets stored in the PI area are used during the operation of the memory controller 120 reading the memory page will be described.

Figure 12:
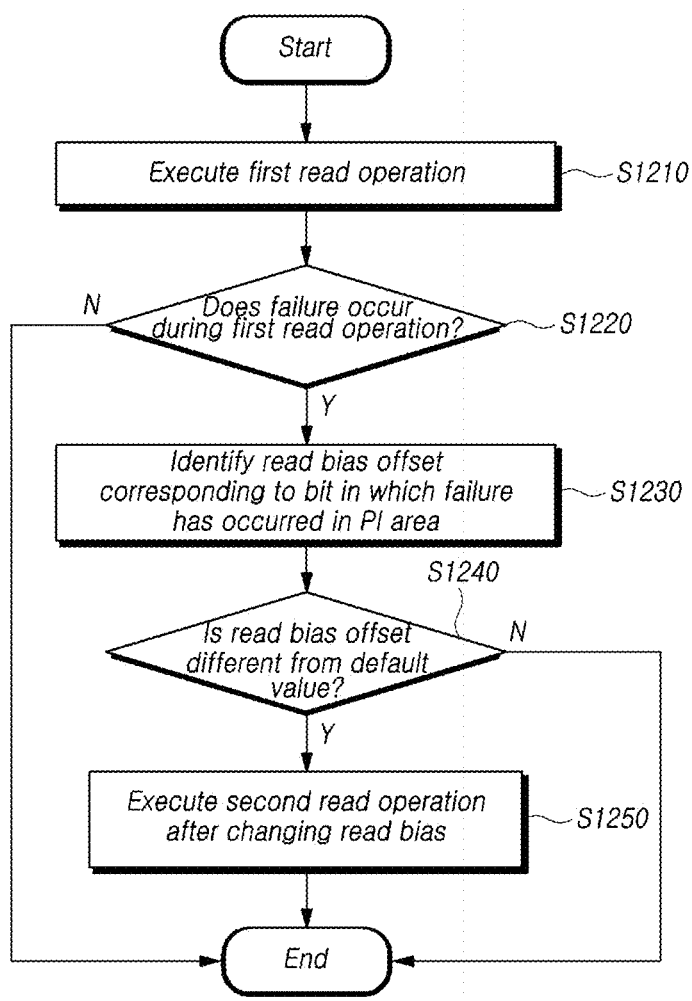
FIG. 12 is a diagram illustrating an example of an operation of reading a memory page based on some implementations of the disclosed technology.

FIG. 12 is a diagram illustrating an example of an operation of reading a memory page in an embodiment of the disclosed technology.

First, the memory controller 120 of the memory system 100 may execute a first read operation on a memory page (S1210). In this case, the first read operation may be executed based on the read bias to which the read bias offset stored in the PI area of the memory page is not applied.

Then, the memory controller 120 determines whether or not a failure occurs during the first read operation (S1220). If a failure does not occur during the first read operation ("N" in S1220), the memory controller 120 may complete the operation of reading the memory page.

On the other hand, if a failure occurs during the first read operation ("Y" in S1220), the memory controller 120 may identify a read bias offset corresponding to the bit in which the failure has occurred in the PI area of the memory page (S1230). For example, if a failure occurs while reading an LSB during the first read operation, the memory controller 120 may identify the value of the first byte in which the read bias offset corresponding to the read bias for identifying the LSB is stored, thereby determining the read bias offset corresponding to the read bias for identifying the LSB.

Thereafter, the memory controller 120 may determine whether or not the read bias offset corresponding to the bit in which the failure has occurred in the PI area is different from a default value (e.g., 0x00) (S1240). The default value indicates that there is no change in the read bias offset.

If the read bias offset corresponding to the bit in which the failure has occurred is different from the default value ("Y" in S1240), the memory controller 120 may change the read bias according to the read bias offset corresponding to the bit in which the failure has occurred, and may then execute a second read operation on the memory page (S1250). On the other hand, if the read bias offset corresponding to the bit in which the failure has occurred is the same as the default value ("N" in S1240), the memory controller 120 may complete the operation of reading the memory page.

For example, if a failure occurs while reading an LSB, the memory controller 120 may change the values of the third read bias R3 and seventh read bias R7 on the basis of the read bias offset for the third read bias R3 and the read bias offset for the seventh read bias R7, which are stored in the first byte, and may then execute the second read operation on the memory page on the basis of the changed third read bias R3 and seventh read bias R7.

Figure 13:
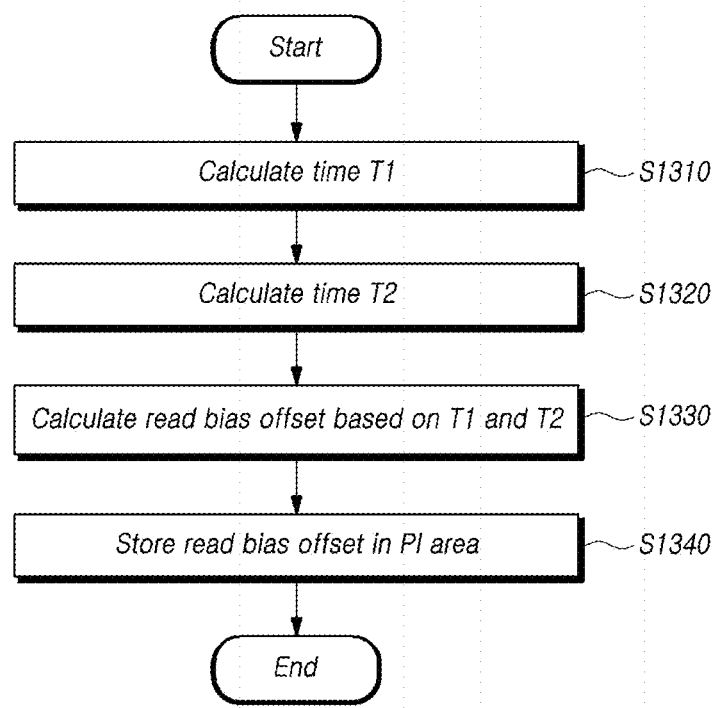
FIG. 13 is a flowchart illustrating an operation method of a memory system based on some implementations of the disclosed technology.

FIG. 13 is a flowchart illustrating an operation method of a memory system 100 according to embodiments of the disclosed technology.

Referring to FIG. 13, the operation method of the memory system 100 may include a step of calculating a time T1 between the time point at which a program operation is started on a memory page included in the memory device 110 and the time point at which the program operation is suspended (S1310).

In addition, the operation method of the memory system 100 may include a step of calculating a time T2 between the time point at which the program operation is suspended and the time point just before the program operation is resumed (S1320).

In addition, the operation method of the memory system 100 may include a step of calculating a read bias offset corresponding to a target read bias among one or more read biases for reading the memory page on the basis of the time T1 and the time T2 (S1330).

The read bias corresponding to the target read bias offset described above may be determined based on the time T1. In addition, the value of the read bias offset may be proportional to the time T2.

In addition, the operation method of the memory system 100 may include a step of storing the read bias offsets calculated in step S1330 in a page information (PI) area of the memory page before the program operation is resumed (S1340).

At this time, the read bias offsets may be stored in a reserved area of the PI area.

A read bias offset corresponding to a read bias for identifying an LSB may be stored in a first byte of the reserved area, a read bias offset corresponding to a read bias for identifying a CSB may be stored in a second byte of the reserved area, and a read bias offset corresponding to a read bias for identifying an MSB may be stored in a third byte of the reserved area. In this case, two different read bias offsets may be stored in the first byte and the third byte, and three different read bias offsets may be stored in the second byte.

Meanwhile, the operation of the memory controller 120 described above may be controlled by the control circuit 123, and may be performed in such a manner that the processor 124 executes (drives) firmware in which the overall operation of the memory controller 120 is programmed.

Figure 14:
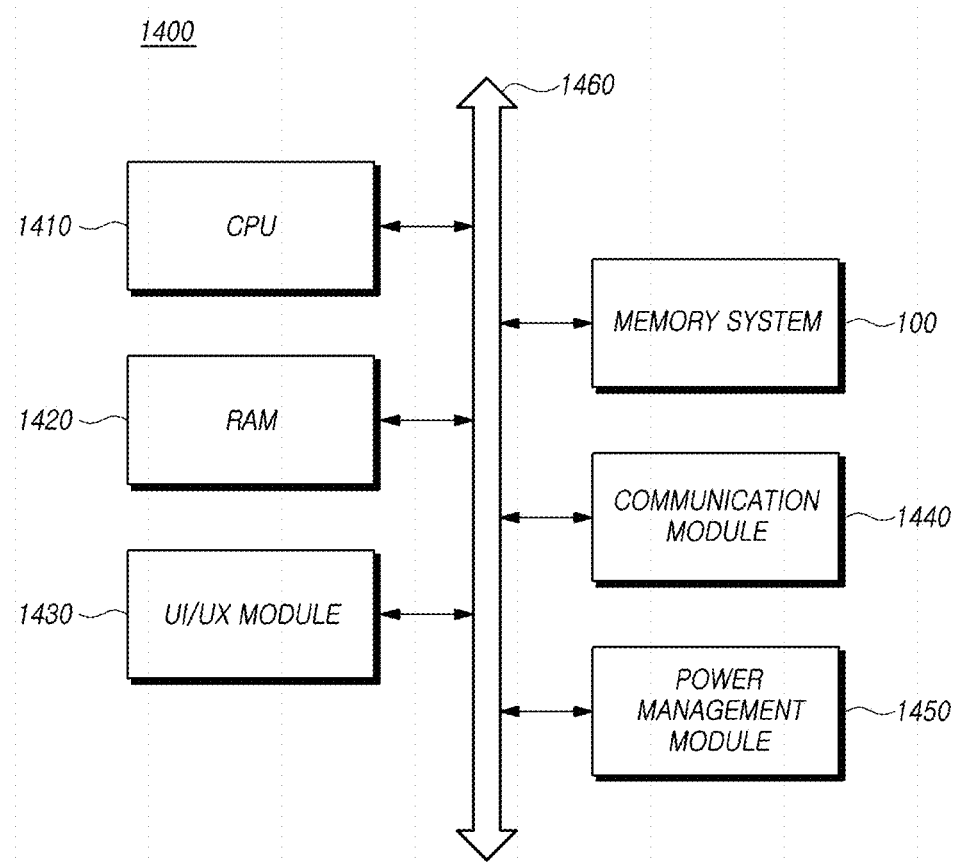
FIG. 14 is a diagram illustrating the configuration of a computing system based on some implementations of the disclosed technology.

FIG. 14 is a diagram illustrating the configuration of a computing system 1400 according to an embodiment of the disclosed technology.

Referring to FIG. 14, the computing system 1400 according to an embodiment of the disclosed technology may include: a memory system 100 electrically connected to a system bus 1460; a CPU 1410 configured to control the overall operation of the computing system 1400; a RAM 1420 configured to store data and information related to operations of the computing system 1400; a user interface/user experience (UI/UX) module 1430 configured to provide the user with a user environment; a communication module 1440 configured to communicate with an external device as a wired and/or wireless type; and a power management module 1450 configured to manage power used by the computing system 1400.

The computing system 1400 may be a personal computer (PC) or may include a mobile terminal such as a smartphone, a tablet or various electronic devices.

The computing system 1400 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

According to embodiments of the disclosed technology described above, the operation delay time of the memory system may be minimized. In addition, according to an embodiment of the disclosed technology, an overhead occurring in the process of calling a specific function may be minimized. Although various embodiments of the disclosed technology have been described for illustrative purposes, various modifications, additions and substitutions are possible based on what is described and/or illustrated in this patent document.

What is claimed is:

1. A memory system comprising:
a memory device including a memory cell array including memory cells to provide digital storage, each memory cell programmable in multiple states, each state defined with a corresponding threshold voltage distribution; and
a memory controller communicatively coupled to the memory device and configured to control the memory device,
wherein the memory controller is configured to:
calculate, in response to receiving a request to suspend a program operation during the program operation to program a certain state to a memory cell included in a memory page, a time period T1 that is between a beginning of the program operation and a suspension of the program operation, wherein the suspension of the program operation causes a change of the threshold voltage distribution of the certain state;
calculate, in response to a request to resume the program operation, a time period T2 that is between the suspension of the program operation and a time point that is before a resumption of the program operation;
calculate, based on the time period T1 and the time period T2, a read offset voltage to be applied to the memory cell to mitigate the change of the threshold voltage distribution; and
store the read offset voltage in the memory page in the memory device before the resumption of the program operation.

2. The memory system of claim 1, wherein the memory controller is configured to store the read offset voltage in a page information (PI) area of the memory page including the memory cell.

3. The memory system of claim 2, wherein the memory controller is configured to store the read offset voltage in a reserved area of the PI area.

4. The memory system of claim 3, wherein the memory controller is configured to store the read offset voltage, used to determine different bit of data, in different bytes of the reserved area.

5. The memory system of claim 1, wherein the memory controller is configured to apply the read offset voltage to the memory cell such that an original read voltage for reading data is changed to a target read voltage.

6. The memory system of claim 5, wherein the memory controller is configured to determine the target read voltage based on the time period T1.

7. The memory system of claim 5, wherein the memory controller is configured to apply the read offset voltage in response to a failure occurring in reading the memory cell.

8. The memory system of claim 1, wherein the memory controller is configured to calculate the read offset voltage such that a value of the read offset voltage is proportional to the time period T2.

9. A memory controller comprising:
a memory interface configured to communicate with a memory device including a memory page including memory cells, each memory cell programmable in multiple states, each state defined with a corresponding threshold voltage distribution; and
a control circuit configured to control the memory device, wherein the control circuit is configured to:
calculate, in response to receiving a request to suspend a program operation during the program operation to program a certain state to the memory page, a time period T1 that is between a beginning of the program operation and a suspension of the program operation, wherein the suspension of the program operation causes a change of the threshold voltage distribution of the certain state;
calculate, in response to a request to resume the program operation, a time period T2 that is between the suspension of the program operation and a time point that is before a resumption of the program operation;
calculate, based on the time period T1 and the time period T2, a read offset voltage to be applied to the memory block to mitigate the change of the threshold voltage distribution; and
store the read offset voltage in the memory page before the resumption of the program operation.

10. The memory controller of claim 9, wherein the control circuit is configured to store the read offset voltage in a page information (PI) area of the memory page.

11. The memory controller of claim 10, wherein the control circuit is configured to store the read offset voltage in a reserved area of the PI area.

12. The memory controller of claim 11, wherein the control circuit is configured to store the read offset voltage, used to determine different bit of data, in different bytes of the reserved area.

13. The memory controller of claim 9, wherein the control circuit is configured to apply the read offset voltage to the memory page such that an original read voltage for reading data is changed to a target read voltage.

14. The memory controller of claim 13, wherein the control circuit is configured to determine the target read voltage based on the time period T1.

15. The memory controller of claim 13, wherein the control circuit is configured to apply the read offset voltage in response to a failure occurring in reading the memory page.

16. The memory controller of claim 9, wherein the control circuit is configured to calculate the read offset voltage such that a value of the read offset voltage is proportional to the time T2.

17. An operation method of a memory system comprising a memory device, the operation method comprising:
   calculating a time period T1 between a beginning of a program operation on a memory cell included in a memory page in the memory device and a suspension of the program operation;
   calculating a time period T2 between the suspension of the program operation and a time point that is before a resumption of the program operation;
   calculating, based on the time period T1 and the time period T2, a read offset voltage to be applied to the memory cell to mitigate a change of a threshold voltage distribution of a certain state of a memory cell, the change caused due to the suspension of the program operation; and
   storing the read offset voltage in the memory page in the memory device before the resumption of the program operation.

18. The operation method of claim 17, further comprising: applying the read offset voltage to the memory cell such that an original read voltage for reading data is changed to a target read voltage.

19. The operation method of claim 18, wherein the target read voltage is determined based on the time period T1.

20. The operation method of claim 18, wherein a value of the read offset voltage is proportional to the time period T2.

21. The operation method of claim 17, wherein the read offset voltage is stored in a reserved area of a PI (page information) area of a memory page including the memory cell.

22. The operation method of claim 21, wherein the read offset voltage, used to determine different bit of data, is stored in different bytes of the reserved area.

* * * * *